United States Patent
Lee (10) Patent No.: US 11,462,710 B2
(45) Date of Patent: Oct. 4, 2022

(54) DISPLAY DEVICE HAVING A REFLECTIVE ELECTRODE

(71) Applicant: LG Display Co., Ltd., Seoul (KR)

(72) Inventor: Kyung-Eon Lee, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/725,086

(22) Filed: Dec. 23, 2019

(65) Prior Publication Data

US 2020/0212346 A1 Jul. 2, 2020

(30) Foreign Application Priority Data

Dec. 28, 2018 (KR) .................. 10-2018-0173032

(51) Int. Cl.
*H01L 51/52* (2006.01)
*H01L 27/32* (2006.01)

(52) U.S. Cl.
CPC ........ *H01L 51/5218* (2013.01); *H01L 27/322* (2013.01); *H01L 27/3246* (2013.01); *H01L 51/5209* (2013.01); *H01L 51/5265* (2013.01); *H01L 51/5284* (2013.01); *H01L 2251/5315* (2013.01); *H01L 2251/558* (2013.01)

(58) Field of Classification Search
CPC .................... H01L 51/5218; H01L 51/5265
See application file for complete search history.

(56) References Cited

U.S. PATENT DOCUMENTS 9,502,475 B2 11/2016 Lee
9,722,000 B2 8/2017 Kim et al.
2009/0278450 A1 11/2009 Sonoyama et al.
2010/0200875 A1 8/2010 Takei
2011/0241000 A1 10/2011 Choi et al.
2011/0297943 A1 12/2011 Kim et al.
(Continued)

FOREIGN PATENT DOCUMENTS

CN 104362257 A 2/2015
CN 104425766 A 3/2015
(Continued)

OTHER PUBLICATIONS

Office Action dated Aug. 10, 2022, issued in corresponding Chinese Patent Application No. 201911181708.0.

*Primary Examiner* — Vincent Wall
(74) *Attorney, Agent, or Firm* — Morgan, Lewis & Bockius LLP (57) ABSTRACT

A display device includes a reflective electrode including a first region and a second region inclined relative to the first region, a lower electrode on the first region of the reflective electrode, a bank insulating layer covering an edge of the lower electrode, the bank insulating layer extending onto the second region of the reflective electrode, an upper electrode on a portion of the lower electrode exposed by the bank insulating layer, the upper electrode extending onto the bank insulating layer, and a light-emitting layer between the lower electrode and the upper electrode. The light-emitting layer extends between the bank insulating layer and the upper electrode. An optical path between the second region of the reflective electrode and the upper electrode is the same as an optical path between the first region of the reflective electrode and the upper electrode.

16 Claims, 7 Drawing Sheets

(56) References Cited

U.S. PATENT DOCUMENTS

| | | | |
|---|---|---|---|
| 2013/0001603 A1* | 1/2013 | Lim | H01L 51/5209 |
| | | | 257/88 |
| 2013/0049028 A1 | 2/2013 | Kim et al. | |
| 2014/0183460 A1 | 7/2014 | Kim et al. | |
| 2014/0183501 A1* | 7/2014 | Kim | H01L 51/56 |
| | | | 257/40 |
| 2015/0060820 A1* | 3/2015 | Takagi | H01L 27/3246 |
| | | | 257/40 |
| 2017/0125740 A1 | 5/2017 | Lee et al. | |
| 2018/0062116 A1* | 3/2018 | Park | H01L 51/5234 |
| 2018/0166648 A1 | 6/2018 | Dai et al. | |

FOREIGN PATENT DOCUMENTS

| | | |
|---|---|---|
| JP | 2011-165621 A | 8/2011 |
| JP | 2015-062194 A | 4/2015 |
| JP | 2017-37825 A | 2/2017 |
| KR | 10-2008-0061675 A | 7/2008 |
| KR | 10-2009-0036483 A | 4/2009 |
| KR | 10-2013-0030842 A | 3/2013 |
| KR | 10-2015-0038982 A | 4/2015 |

* cited by examiner

FIG. 7

DISPLAY DEVICE HAVING A REFLECTIVE ELECTRODE

This application claims the priority benefit of Korean Patent Application No. 10-2018-0173032, filed on Dec. 28, 2018, which is hereby incorporated by reference as if fully set forth herein.

BACKGROUND

Technical Field

The present disclosure relates to a display device, and more particularly, to a display device having a reflective electrode for improving light-extraction efficiency.

Discussion of the Related Art

Generally, an electronic appliance, such as a monitor, a television (TV), a laptop computer, or a digital camera, includes a display device to display an image. In an example, the display device may include a plurality of light-emitting elements. Each of the light-emitting elements may emit light displaying a specific color. Furthermore, each of the light-emitting elements may include a light-emitting layer between a lower electrode and an upper electrode.

The display device may use a reflective electrode for improving efficiency of the light-emitting element. For example, in the display device, the reflective electrode may include a flat region and an inclined region. The light-emitting element may be disposed on the flat region of the reflective electrode. Thus, in the display device, the light confined by the total reflection may be emitted to the outside by the inclined region of the reflective electrode.

However, because the light emitted from the inclined region of the reflective electrode has brightness and color coordinates that may be different from the light reflected by the flat region of the reflective electrode, brightness and color of the image realized by the display device may be degraded due to the light emitted from the inclined region of the reflective electrode.

SUMMARY

Accordingly, the present disclosure is directed to a display device having a reflective electrode that substantially obviates one or more problems due to limitations and disadvantages of the related art.

An aspect of the present disclosure is to provide a display device that may be capable of improving light-extraction efficiency without quality deterioration of the realized image.

Another aspect of the present disclosure is to provide a display device where the light emitted from the inclined region of the reflective electrode may have brightness and color coordinates that are the same as those of the light reflected by the flat region of the reflective electrode.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device comprises a reflective electrode including a first region and a second region inclined relative to the first region; a lower electrode on the first region of the reflective electrode; a bank insulating layer covering an edge of the lower electrode, the bank insulating layer extending onto the second region of the reflective electrode; an upper electrode on a portion of the lower electrode exposed by the bank insulating layer, the upper electrode extending onto the bank insulating layer; and a light-emitting layer between the lower electrode and the upper electrode, the light-emitting layer extending between the bank insulating layer and the upper electrode. An optical path between the second region of the reflective electrode and the upper electrode is the same as an optical path between the first region of the reflective electrode and the upper electrode.

A spacing distance between the second region of the reflective electrode and the upper electrode may be different from a spacing distance between the first region of the reflective electrode and the upper electrode.

The light-emitting layer may be in contact with the lower electrode and the bank insulating layer.

The refractive index of the bank insulating layer may be smaller than the refractive index of the lower electrode, and a thickness of the bank insulating layer on the second region of the reflective electrode may be greater than a thickness of the lower electrode on the second region of the reflective electrode.

A resonance layer may be between the first region of the reflective electrode and the lower electrode, wherein the resonance layer may extend between the second region of the reflective electrode and the bank insulating layer.

A thickness of the resonance layer between the first region of the reflective electrode and the lower electrode may be the same as a thickness of the resonance layer between the second region of the reflective electrode and the bank insulating layer.

The resonance layer may include at least one contact hole partially exposing the first region of the reflective electrode, and the contact hole of the resonance layer may overlap with the bank insulating layer.

The bank insulating layer may include an inorganic insulating material.

In another aspect, a display device comprises a lower electrode on a lower substrate; a first bank insulating layer spaced from the lower electrode, the first bank insulating layer having an inclined side surface that faces the lower electrode; a second bank insulating layer covering an edge of the lower electrode and on the inclined side surface of the first bank insulating layer; a reflective electrode between the lower substrate and the lower electrode, the reflective electrode extending between the first bank insulating layer and the second bank insulating layer; a light-emitting layer on a portion of the lower electrode exposed by the second bank insulating layer; and an upper electrode on the light-emitting layer, wherein a thickness ratio of the second bank insulating layer and the lower electrode is the same as the refractive index ratio of the lower electrode and the second bank insulating layer.

The second bank insulating layer and the lower electrode may be in contact with the reflective electrode.

The second bank insulating layer may include a material different from the first bank insulating layer.

The first bank insulating layer may include an organic insulating material.

The inclined side surface of the first bank insulating layer may include a first region having a first inclination angle, and a second region having a second inclination angle that is smaller than the first inclination angle, and the first region of the first bank insulating layer may be between the lower substrate and the second region of the first bank insulating layer.

The first region of the first bank insulating layer may have a vertical distance larger than a thickness of the reflective electrode.

An over-coat layer may be between the lower substrate and the lower electrode, wherein the second bank insulating layer may include a same material as the over-coat layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION OF THE EMBODIMENTS

Reference will now be made in detail to embodiments of the present disclosure, examples of which are illustrated in the accompanying drawings.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
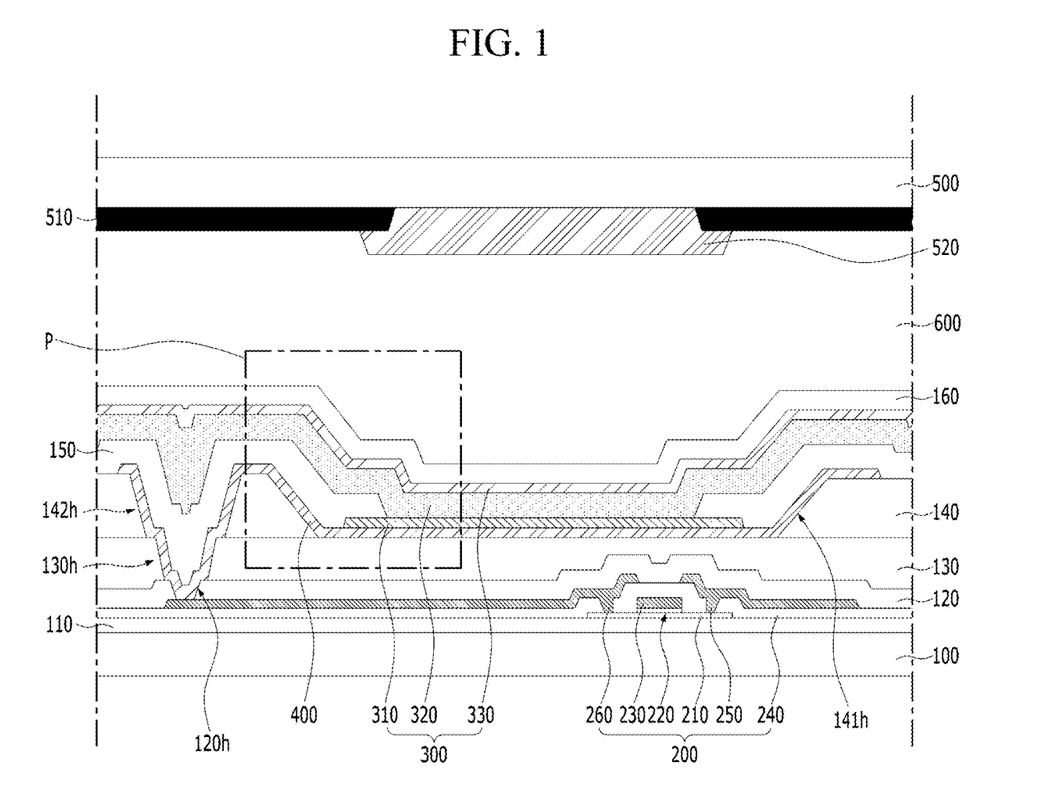
FIG. 1 is a view showing a display device according to an embodiment of the present disclosure.
Figure 2:
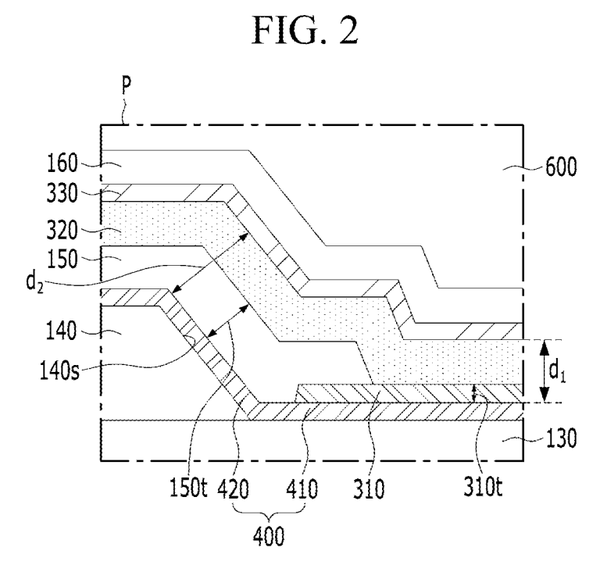
FIG. 2 is an enlarged view of region P in FIG. 1.

FIG. 1 is a view showing a cross-section of a display device according to an embodiment of the present disclosure. FIG. 2 is an enlarged view of region P in FIG. 1.

With reference to FIGS. 1 and 2, the display device according to an embodiment of the present disclosure may include a lower substrate 100. The lower substrate 100 may include an insulating material. For example, the lower substrate 100 may include glass or plastic.

A driving circuit having at least one thin film transistor 200 may be disposed on the lower substrate 100. The driving circuit may generate a driving current corresponding to a data signal provided by a data line according to a scan signal supplied by a scan line. For example, the thin film transistor 200 may include a semiconductor pattern 210, a gate insulating layer 220, a gate electrode 230, an interlayer insulating layer 240, a source electrode 250, and a drain electrode 260.

The semiconductor pattern 210 may be disposed close to the lower substrate 100. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region, and a channel region. The channel region may be disposed between the source region and the drain region. The channel region may have conductivity lower than the source region and the drain region. For example, the source region and the drain region may have an impurity concentration higher than the channel region.

The gate insulating layer 220 may be disposed on a portion of the semiconductor pattern 210. For example, the channel region of the semiconductor pattern 210 may be disposed between the lower substrate 100 and the gate insulating layer 220. The gate insulating layer 220 may expose the source region and the drain region of the semiconductor pattern 210.

The gate insulating layer 220 may include an insulating material. For example, the gate insulating layer 220 may include silicon oxide and/or silicon nitride. The gate insulating layer 220 may have a multi-layer structure. The gate insulating layer 220 may include a high-K material. For example, the gate insulating layer 220 may include hafnium oxide (HfO) or titanium oxide (TiO).

The gate electrode 230 may be disposed on the gate insulating layer 220. The gate electrode 230 may be insulated from the semiconductor pattern 210 by the gate insulating layer 220. The gate electrode 230 may overlap the channel region of the semiconductor pattern 210.

The gate electrode 230 may include a conductive material. For example, the gate electrode 230 may include a metal, such as aluminum (Al), chrome (Cr), molybdenum (Mo) or tungsten (W).

The interlayer insulating layer 240 may be disposed on the semiconductor pattern 210 and the gate electrode 230. The interlayer insulating layer 240 may be extended beyond the semiconductor pattern 210. For example, side surfaces of the semiconductor pattern 210 and the gate electrode 230 may be covered by the interlayer insulating layer 240.

The interlayer insulating layer 240 may include an insulating material. For example, the interlayer insulating layer 240 may include an inorganic insulating material, such as silicon oxide.

The source electrode 250 may be disposed on the interlayer insulating layer 240, and may be electrically connected to the source region of the semiconductor pattern 210. In an example, the interlayer insulating layer 240 may include a contact hole on the source region of the semiconductor pattern 210. The source electrode 250 may include a portion overlapping with the source region of the semiconductor pattern 210.

The source electrode 250 may include a conductive material. For example, the source electrode 250 may include a metal, such as aluminum (Al), chrome (Cr), molybdenum (Mo), or tungsten (W). The source electrode 250 may include a material different from the gate electrode 230.

The drain electrode 260 may be disposed on the interlayer insulating layer 240, and may be electrically connected to the drain region of the semiconductor pattern 210. Furthermore, the drain electrode 260 may be spaced away from the source electrode 250. In an example, the interlayer insulating layer 240 may include a contact hole on the drain region of the semiconductor pattern 210. The drain electrode 260 may include a portion overlapping with the drain region of the semiconductor pattern 210.

The drain electrode 260 may include a conductive material. For example, the drain electrode 260 may include a metal, such as aluminum (Al), chrome (Cr), molybdenum (Mo), or tungsten (W). The drain electrode 260 may include a material that is the same as the source electrode 250. Furthermore, the drain electrode 260 may include a material different from the gate electrode 230.

A buffer layer 110 may be disposed between the lower substrate 100 and the driving circuit. The buffer layer 110 may prevent pollution from the lower substrate 100 during the process of forming the driving circuit. The buffer layer 110 may be entirely formed on an upper surface of the lower substrate 100 toward the driving circuit. For example, the buffer layer 110 may extend between the lower substrate 100 and the semiconductor pattern 210. The semiconductor pattern 210 may be in direct contact with the buffer layer 110. The buffer layer 110 may be in direct contact with the interlayer insulating layer 240 outside the semiconductor pattern 210.

The buffer layer 110 may include an insulating material. In an example, the buffer layer 110 may include an inorganic insulating layer, such as include silicon oxide (SiO) and/or silicon nitride (SiN). The buffer layer 110 may have a multi-layer structure.

A lower passivation layer 120 may be disposed on the driving circuit. The lower passivation layer 120 may prevent damage to the driving circuit due to external moisture and impact. The lower passivation layer 120 may extend onto an upper surface of the driving circuit opposite to the lower substrate 100. For example, the thin film transistor 200 may be completely covered by the lower passivation layer 120.

The lower passivation layer 120 may include an insulating material. For example, the lower passivation layer 120 may include an inorganic insulating material. The lower passivation layer 120 may include a material different from the interlayer insulating layer 240. For example, the lower passivation layer 120 may include silicon nitride (SiN).

An over-coat layer 130 may be disposed on the lower passivation layer 120. The over-coat layer 130 may remove a thickness difference due to the driving circuit. For example, an upper surface of the over-coat layer 130 opposite to the lower substrate 100 may be a flat surface. The over-coat layer 130 may extend along the lower passivation layer 120.

The over-coat layer 130 may include an insulating material. The over-coat layer 130 may include a material different from the lower passivation layer 120. For example, the over-coat layer 130 may include an organic insulating material.

A first bank insulating layer 140 may be disposed on the over-coat layer 130. The first bank insulating layer 140 may include an insulating material. For example, the first bank insulating layer 140 may include an organic insulating material. The first bank insulating layer 140 may include a material different from the over-coat layer 130.

The first bank insulating layer 140 may include an opening 141h. The opening 141h may expose a portion of the over-coat layer 130. A side surface 140s of the first bank insulating layer 140 toward the opening 141h may be inclined.

A light-emitting device 300 may be disposed in the opening 141h of the first bank insulating layer 140. The light-emitting device 300 may emit light realizing a specific color. For example, the light-emitting device 300 may include a lower electrode 310, a light-emitting layer 320 and an upper electrode 330, which are sequentially stacked on the over-coat layer 130.

The lower electrode 310 may be spaced away from the first bank insulating layer 140. For example, the lower electrode 310 may be spaced away from the inclined side surface 140s of the first bank insulating layer 140. The inclined side surface 140s of the first bank insulating layer 140 may face a side surface of the lower electrode 310.

The lower electrode 310 may include a conductive material. Furthermore, the lower electrode 310 may include a transparent material. For example, the lower electrode 310 may be a transparent electrode formed of a transparent conductive material, such as ITO or IZO.

The light-emitting layer 320 may generate light having luminance corresponding to a voltage difference between the lower electrode 310 and the upper electrode 330. For example, the light-emitting layer 320 may include an emission material layer (EML) having an emission material. The emission material may be an organic material. For example, the display device according to the embodiment of the present disclosure is an organic light-emitting display device having an organic emission material.

The light-emitting layer 320 may have a multi-layer structure in order to increase luminous efficiency. For example, the light-emitting layer 320 may further include at least one of a hole injection layer (HIL), a hole transporting layer (HTL), an electron transporting layer (ETL), and an electron injection layer (EIL).

The upper electrode 330 may include a conductive material. Furthermore, the upper electrode 330 may be transparent. For example, the upper electrode 330 may be a transparent electrode formed of a transparent conductive material, such as ITO or IZO. The upper electrode 330 may include a material different from the lower electrode 310. For example, the upper electrode 330 may include a metal, such as aluminum (Al). The upper electrode 330 may include a thickness that is less than the lower electrode 310.

An edge of the lower electrode 310 may be covered by a second bank insulating layer 150. The light-emitting layer 320 and the upper electrode 330 may be stacked on a portion of the lower electrode 310 exposed by the second bank insulating layer 150. Thus, in the display device according to the embodiment of the present disclosure, damage of the light-emitting layer 320 due to the edge of the lower electrode 310 may be prevented.

The second bank insulating layer 150 may extend onto the inclined side surface 140s of the first bank insulating layer 140. The light-emitting layer 320 and the upper electrode 330 may extend onto the second bank insulating layer 150. For example, the second bank insulating layer 150 may extend between the first bank insulating layer 140 and the light-emitting layer 320. The second bank insulating layer 150 may include an insulating material. Thus, in the display device according to the embodiment of the present disclosure, the generation of light by the light-emitting layer 320 on the inclined side surface 140s of the first bank insulating layer 140 may be prevented. That is, in the display device according to the embodiment of the present disclosure, destructive interference due to the generating position and emitting angle of light emitted from the light-emitting layer 320 may be prevented. Therefore, in the display device according to the embodiment of the present disclosure, efficiency degradation of the light-emitting device 300 may be prevented.

The second bank insulating layer 150 may include a material different from the first bank insulating layer 140. For example, the second bank insulating layer 150 may include an inorganic insulating material, such as silicon oxide (SiO) or silicon nitride (SiN).

A reflective electrode 400 may be disposed between the over-coat layer 130 and the lower electrode 310. The reflective electrode 400 may have a reflective ratio higher than the lower electrode 310. For example, the reflective electrode 400 may include a metal, such as aluminum (Al) or silver (Ag). Thus, in the display device according to the embodiment of the present disclosure, the light emitted from the light-emitting layer 320 toward the lower electrode 310 may be reflected toward the upper electrode 330 by the reflective electrode 400. That is, in the display device according to the embodiment of the present disclosure, the light generated by the light-emitting layer 320 may be emitted outside through the upper electrode 330.

The reflective electrode 400 may extend between the first bank insulating layer 140 and the second bank insulating layer 150. For example, the reflective electrode 400 may include a first region 410 disposed between the lower substrate 100 and the lower electrode 310, and a second region 420 disposed between the first bank insulating layer 140 and the second bank insulating layer 150.

The first region 410 of the reflective electrode 400 may be in contact with the upper surface of the over-coat layer 130. For example, the first region 410 of the reflective electrode 400 may be a flat region. The second region 420 of the reflective electrode 400 may be in contact with the inclined side surface 140s of the first bank insulating layer 140. For example, the second region 420 of the reflective electrode 400 may be an inclined region. Thus, in the display device according to the embodiment of the present disclosure, the light confined by the total reflection may be emitted toward the upper electrode 330 by the second region 420 of the reflective electrode 400. Therefore, in the display device according to the embodiment of the present disclosure, light-extraction efficiency may be improved.

The optical path between the second region 420 of the reflective electrode 400 and the upper electrode 330 may be the same as the optical path between the first region 410 of the reflective electrode 400 and the upper electrode 330. Because the optical path is a product of the thickness and the refractive index of a material stacked on the corresponding area, the light of the same optical path may include the same brightness and color coordinates. Thus, in the display device according to the embodiment of the present disclosure, the light emitted from the second region 420 of the reflective electrode 400 may have brightness and color coordinates that are the same as those of the light reflected by the first region 410 of the reflective electrode 400.

A spaced distance d1 between the first region 410 of the reflective electrode 400 and the upper electrode 330 on the portion of the lower electrode 310 exposed by the second bank insulating layer 150 may be different from a spaced distance d2 between the second region 420 of the reflective electrode 400 and the upper electrode 330 on the inclined side surface 140s of the first bank insulating layer 140. For example, the lower electrode 310 may be in direct contact with the first region 410 of the reflective electrode 400, the second bank insulating layer 150 may be in direct contact with the second region 420 of the reflective electrode 400, and the light-emitting layer 320 may be in direct contact with the second bank insulating layer 150 and the lower electrode 310. Thus, in the display device according to the embodiment of the present disclosure, the difference between the optical path between the first region 410 of the reflective electrode 400 and the upper electrode 330, and the optical path between the second region 420 of the reflective electrode 400 and the upper electrode 330, may be determined by the difference of the thickness and the refractive index of the lower electrode 310 and the second bank insulating layer 150. That is, in the display device according to the embodiment of the present disclosure, the thickness ratio of the second bank insulating layer 150 and the lower electrode 310 may be the same as the refractive index ratio of the lower electrode 310 and the second bank insulating layer 150.

In the display device according to the embodiment of the present disclosure, the thickness of the second bank insulating layer 150 may be equal to a value dividing a product of the thickness and the refractive index of the lower electrode 330 by the refractive index of the second bank insulating layer 150. For example, in the display device according to the embodiment of the present disclosure, the second bank insulating layer 150 may have a refractive index lower than the lower electrode 330, and a thickness 150t of the second bank insulating layer 150 on the second region 420 of the reflective electrode 400 may be thicker than a thickness 310t of the lower electrode 310. That is, in the display device according to the embodiment of the present disclosure, the thickness and/or the refractive index of the second bank insulating layer 150 may be determined by the thickness and the refractive index of the lower electrode 310. Thus, in the display device according to the present disclosure, the light-extraction efficiency may be improved without deterioration of the emission efficiency.

The reflective electrode 400 may be electrically connected to the driving circuit. For example, the lower passivation layer 120 may include a lower contact hole 120h on the drain electrode 260 of the thin film transistor 200, and the over-coat layer 130 may include an over-coat contact hole 130h overlapping with the lower contact hole 120h. The lower contact hole 120h and the over-coat contact hole 130h may be disposed at the outside of the opening 141h of the first bank insulating layer 140. For example, the first bank insulating layer 140 may further include a bank contact hole 142h overlapping with the over-coat contact hole 130h. The bank contact hole 142h of the first bank insulating layer 140 may be spaced away from the inclined side surface 140s of the first bank insulating layer 140. The reflective electrode 400 may extend along a side wall of the lower contact hole 120h, a side wall of the over-coat contact hole 130h, and a side wall of the bank contact hole 142h. For example, the reflective electrode 400 may be in direct contact with the drain electrode 260 of the thin film transistor 200 in the lower contact hole 120h. The lower electrode 310 may be electrically connected to the thin film transistor 200 by the reflective electrode 400. Thus, in the display device according to the embodiment of the present disclosure, light-extraction efficiency may be improved without being influenced by the electrical connection between the thin film transistor 200 and the light-emitting device 300.

An upper passivation layer 160 may be disposed on the light-emitting device 300. The upper passivation layer 160 may prevent damage to the light-emitting device 300 due to external moisture and impact. The upper passivation layer 160 may extend along the upper electrode 330. For example, the upper passivation layer 160 may include a portion overlapping with the first region 410 and the second region 420 of the reflective electrode 400.

The upper passivation layer 160 may include an insulating material. For example, the upper passivation layer 160 may include an inorganic insulating material, such as silicon oxide (SiO) or silicon nitride (SiN). The upper passivation layer 160 may have a multi-layer structure. For example, the upper passivation layer 160 may have a structure in which an organic layer formed of an organic insulating material is disposed between inorganic layers formed of an inorganic insulating material.

An upper substrate 500 may be disposed on the upper passivation layer 160. The upper substrate 500 may include an insulating material. The upper substrate 500 may include a transparent material. For example, the upper substrate 500 may include glass or plastic. Thus, in the display device according to the embodiment of the present disclosure, an image by the light emitted from the light-emitting device 300 may be realized on an outer surface of the upper substrate 500. The upper substrate 500 may include a material different from the lower substrate 100.

A black matrix 510 and a color filter 520 may be disposed on a lower surface of the upper substrate 500 toward the lower substrate 100. The color filter 520 may be disposed between the black matrix 510. The color filter 520 may overlap the portion of the lower electrode 310 exposed by the second bank insulating layer 150. Thus, the light emitted from each light-emitting device 300 may realize the color corresponding to the corresponding pixel.

An adhesive layer 600 may be disposed between the upper passivation layer 160 and the black matrix 510, and between the upper passivation layer 160 and the color filter 520. The upper substrate 500 on which the black matrix 510 and the color filter 520 are formed, may be coupled with the lower substrate 100 on which the light-emitting device 300 is formed, by the adhesive layer 600.

Accordingly, the display device according to the embodiment of the present disclosure may adjust the optical path of the light emitted from the inclined region of the reflective electrode 400 by the relative thickness and the relative refractive index of the second bank insulating layer 150, which covers the edge of the lower electrode 310 on the flat region of the reflective electrode 400 and extends onto the inclined region of the reflective electrode 400. Thus, in the display device according to the embodiment of the present disclosure, the light emitted from the inclined region of the reflective electrode 400 may have brightness and color coordinates that are the same as those of the light reflected by the flat region of the reflective electrode 400. Therefore, in the display device according to the embodiment of the present disclosure, light-extraction efficiency may be improved without quality deterioration of the realized image.

Figure 3:
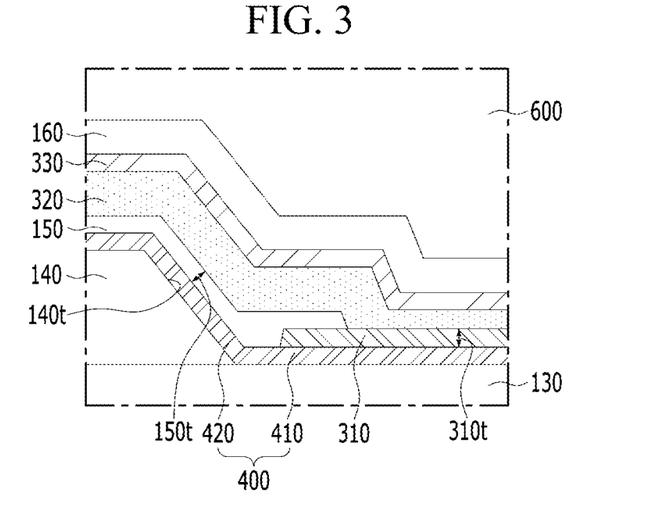
FIGS. 3 to 7 are views respectively showing the display device according to another embodiment of the present disclosure.

In the display device according to the embodiment of the present disclosure, it is described that the second bank insulating layer 150 has a different thickness from the lower electrode 310. However, embodiments are not limited thereto. In the display device according to another embodiment of the present disclosure, the second bank insulating layer 150 may have the same refractive index as the lower electrode 310. For example, in the display device according to another embodiment of the present disclosure, the thickness 150t of the second bank insulating layer 150 may be the same as the thickness 310t of the lower electrode 310, as shown in FIG. 3. The second bank insulating layer 150 may have a multi-layer structure which includes insulating layers having different refractive index. Thus, in the display device according to another embodiment of the present disclosure, the reduction of the emission area due to the thickness 150t of the second bank insulating layer 150 may be reduced and possibly minimized, and the light-extraction efficiency may be improved.

Figure 4:
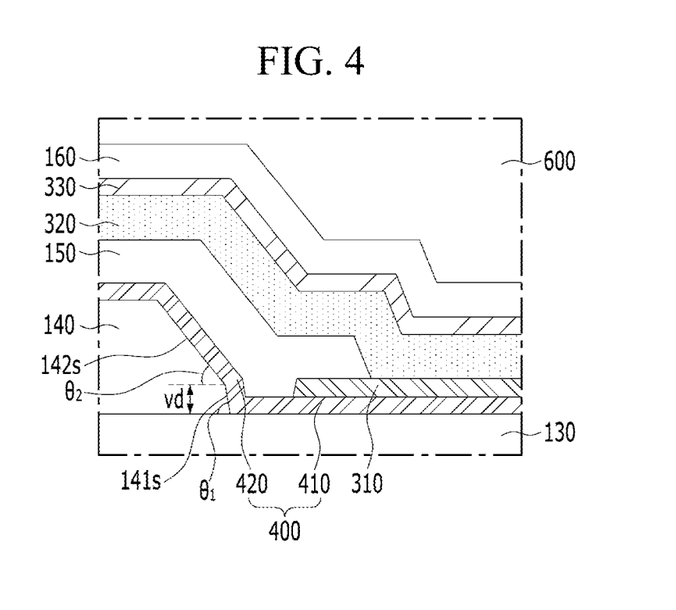

In the display device according to the embodiment of the present disclosure, it is described that the inclined side surface 140s of the first bank insulating layer 140 includes a single inclination angel. However, in the display device according to another embodiment of the present disclosure, a side surface of the first bank insulating layer 140 toward the lower electrode 310 may have a plurality of regions having different inclination angles. For example, in the display device according to another embodiment of the present disclosure, the inclined side surface 140s of the first bank insulating layer 140 may include a first region 141s having a first inclination angle θ1, and a second region 142s having a second inclination angle θ2, as shown in FIG. 4. The first region 141s of the first bank insulating layer 140 may be disposed near the over-coat layer 130. For example, the first region 141s of the first bank insulating layer 140 may be disposed between the over-coat layer 130 and the second region 142s of the first bank insulating layer 140.

The first region 141s of the first bank insulating layer 140 may have a vertical distance vd larger than the thickness of the reflective electrode 400. For example, the first region 410 of the reflective electrode 400 may be disposed in the first region 141s of the first bank insulating layer 140. Thus, in the display device according to another embodiment of the present disclosure, the thickness difference due to a portion of the second bank insulating layer 150 covering the edge of the lower electrode 310 may be reduced and possibly minimized. Therefore, in the display device according to another embodiment of the present disclosure, the optical path of the light emitted from the second region 420 of the reflective electrode 400 may be efficiently adjusted by using the second bank insulating layer 150.

The second inclination angle θ2 may be smaller than the first inclination angle θ1. For example, the second inclination angle θ2 may be 40° to 70°. Thus, the display device according to another embodiment of the present disclosure may reduce and possibly minimize the thickness difference of the second bank insulating layer 150, and may adjust the direction of the light emitted from the second region 420 of the reflective electrode 400. Therefore, in the display device according to another embodiment of the present disclosure, light-extraction efficiency may be improved.

In the display device according to the embodiment of the present disclosure, it is described that the lower electrode 310 and the second bank insulating layer 150 are in direct contact with the reflective electrode 400. However, the display device according to another embodiment of the present disclosure may include a micro-cavity structure.

Figure 5:
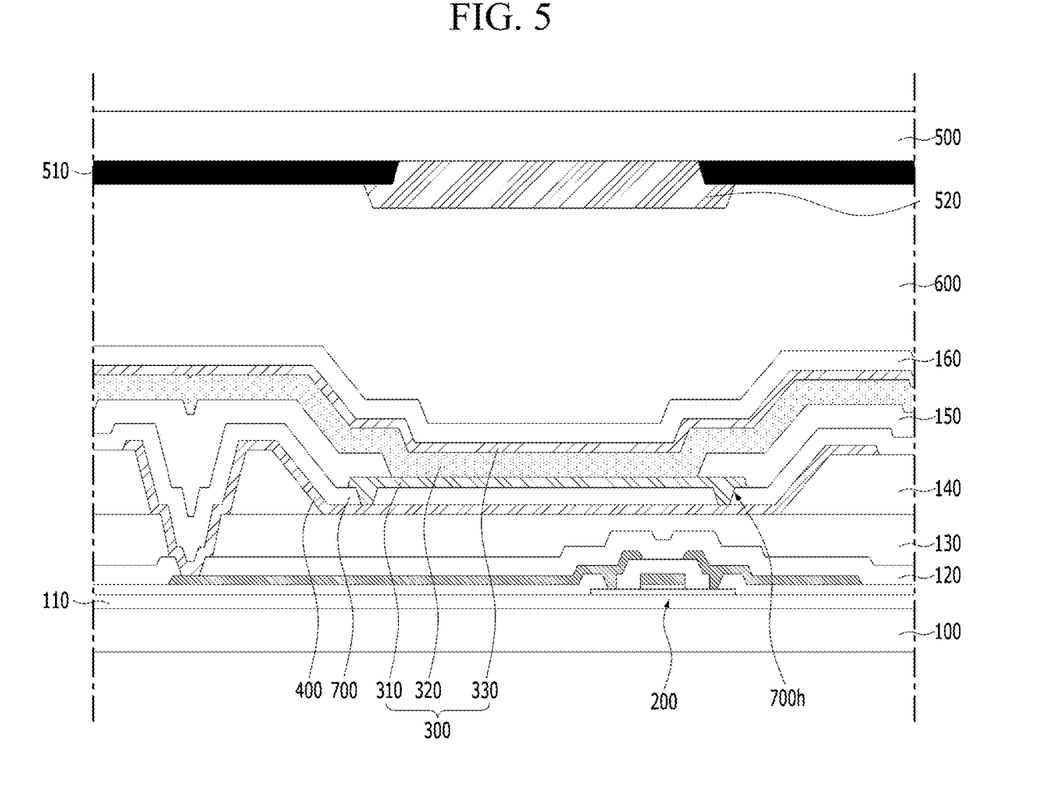

For example, in the display device according to another embodiment of the present disclosure, a resonance layer 700 is disposed between the first region 410 of the reflective electrode 400 and the lower electrode 310 as shown in FIG. 5. The resonance layer 700 may extend onto the second region 420 of the reflective electrode 400. For example, the second bank insulating layer 150 may be in direct contact with the resonance layer 700. The resonance layer 700 may extend between the reflective electrode 400 and the second bank insulating layer 150. The thickness of the resonance layer 700 between the first region 410 of the reflective electrode 400 and the lower electrode 310 may be the same as the thickness of the resonance layer 700 between the second region 420 of the reflective electrode 400 and the second bank insulating layer 150. Thus, the display device according to another embodiment of the present disclosure may reduce and possibly minimize the loss of the light due to destructive interference in the micro-cavity structure.

The resonance layer 700 may include at least one contact hole 700*h* partially exposing the first region 410 of the reflective electrode 400. The lower electrode 310 may be electrically connected to the reflective electrode 400 through the contact hole 700*h* of the resonance layer 700. The contact hole 700*h* of the resonance layer 700 may overlap the second bank insulating layer 150. Thus, in the display device according to another embodiment of the present disclosure, the reduction of the emission area due to the contact hole 700*h* of the resonance layer 700 may be prevented.

Figure 6:
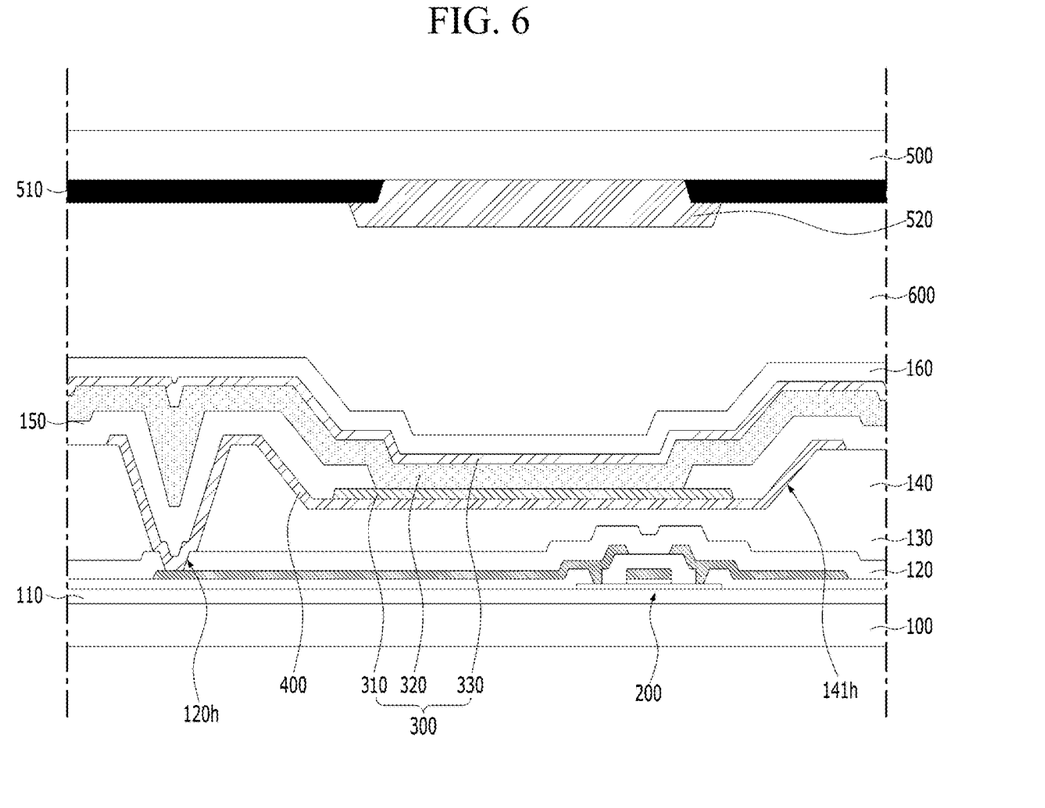

In the display device according to the embodiment of the present disclosure, it is described that the first bank insulating layer 140 includes a material different from the over-coat layer 130. However, the display device according to another embodiment of the present disclosure may include the first bank insulating layer 140 formed of the same material as the over-coat layer 130. Thus, for example, in the display device according to another embodiment of the present disclosure, there may be no interface between the over-coat layer 130 and the first bank insulating layer 140, as shown in FIG. 6. Thus, in the display device according to another embodiment of the present disclosure, the process of forming the first bank insulating layer 140 may be simplified.

For example, a method of forming the display device according to another embodiment of the present disclosure may include a step of forming an insulating layer including an organic insulating material on the lower passivation layer 120 to be relatively thick, and a step of forming a groove 141*h* having an inclined side surface at the insulating layer. That is, in the display device according to another embodiment of the present disclosure, the over-coat layer 130 and the first bank insulating layer 140 may be formed at the same time. Therefore, in the display device according to another embodiment of the present disclosure, process efficiency and light-extraction efficiency may be improved.

In the display device according to the embodiment of the present disclosure, it is described that the second bank insulating layer 150 is a linear insulating layer having a certain thickness. However, in the display device according to another embodiment of the present disclosure, the second bank insulating layer 150 may include an organic insulating material. For example, with reference to FIG. 7, in the display device according to another embodiment of the present disclosure, the second bank insulating layer 150 having an opening 150*h*, which exposes a portion of the lower electrode 310, may include an upper surface toward the upper substrate 500. The upper surface of the second bank insulating layer 150 may be a flat surface. Thus, in the display device according to another embodiment of the present disclosure, the degree of freedom for a material of the second bank insulating layer 150 may be improved. Therefore, in the display device according to another embodiment of the present disclosure, process efficiency and light-extraction efficiency may be optimized without quality deterioration of the realized image.

Figure 7:
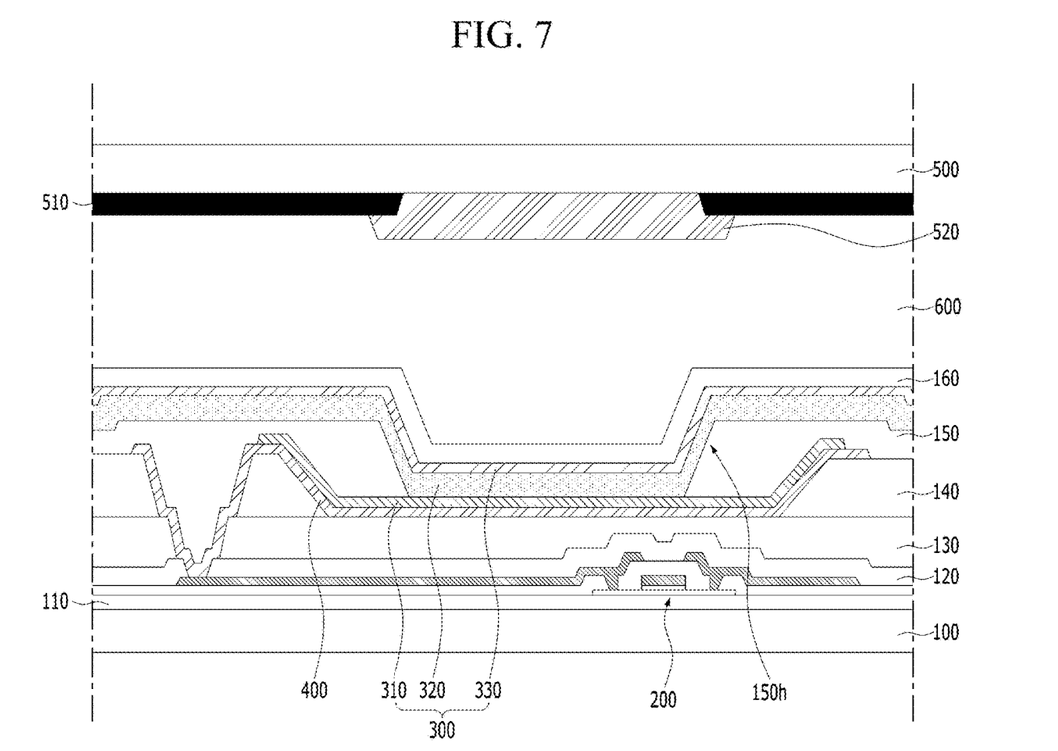

In the display device according to the embodiment of the present disclosure, it is described that the light-emitting layer 320 on the inclined side surface 140*s* of the first bank insulating layer 140 has the same thickness as the light-emitting layer 320 on the portion of the lower electrode 310 exposed by the first bank insulating layer 140. However, in the display device according to another embodiment of the present disclosure, the light-emitting layer 320 may include a relatively thin thickness on the inclined side surface of the first bank insulating layer 140, as shown in FIG. 7. In the display device according to another embodiment of the present disclosure, the lower electrode 310 may extend onto the inclined surface of the first bank insulating layer 140. That is, the display device according to another embodiment of the present disclosure may prevent a difference of brightness and color coordinates of the light emitted from the inclined region of the reflective electrode 400 and the light reflected by the flat region of the reflective electrode 400 due to the thickness variation of the light-emitting layer 320 by using the lower electrode 310 and the second bank insulating layer 150. Thus, in the display device according to another embodiment of the present disclosure, the degree of freedom for the process of forming the light-emitting layer 320 may be improved.

In addition, in the display device according to another embodiment of the present disclosure, it is described that the quality deterioration of the realized image due to the thickness variation of the light-emitting layer 320 is prevented by using the lower electrode 310 and the second bank insulating layer 150. However, in the display device according to yet another embodiment of the present disclosure, differences of brightness and color coordinates of the light due to the thickness variation of the light-emitting layer 320 may be compensated only by the thickness of the second bank insulating layer 150. For example, in the display device according to yet another embodiment of the present disclosure, the second bank insulating layer 150 may have a thickness which sufficiently compensates a difference of the optical path due to the thickness difference between the lower electrode 310 and the light-emitting layer 320. That is, in the display device according to yet another embodiment of the present disclosure, the optical path by the lower electrode 310 and the light-emitting layer 320, which are stacked on the flat region of the reflective electrode 400, may be the same as the optical path by the second bank insulating layer 150 and the light-emitting layer 320, which are stacked on the inclined region of the reflective electrode 400. Thus, in the display device according to yet another embodiment of the present disclosure, the light-extraction efficiency may be efficiently improved without quality deterioration of the realized image.

The display device according to embodiments of the present disclosure may include the lower electrode on the flat region of the reflective electrode, and the bank insulating layer covering the edge of the lower electrode, wherein the bank insulating layer may extend onto the inclined region of the reflective electrode, and the thickness and the refractive index of the bank insulating layer may be determined by the thickness and the refractive index of the lower electrode. That is, in the display device according to the embodiments of the present disclosure, the light emitted from the inclined region of the reflective electrode may have the same optical path as the light reflected by the flat region of the reflective electrode. Thus, in the display device according to the embodiments of the present disclosure, the quality deterioration of the realized image due to the inclined region of the reflective electrode may be prevented. Therefore, in the display device according to the embodiments of the present disclosure, the light-extraction efficiency may be improved without the quality deterioration of the realized image.

It will be apparent to those skilled in the art that various modifications and variations can be made in the display device having a reflective electrode of the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
    a reflective electrode including:
        a first region;
        a second region inclined relative to the first region; and
        a third region parallel to the first region, the second region being between the first region and the third region;
    a lower electrode on the first region of the reflective electrode, the second region of the reflective electrode disposed outside the lower electrode;
    a bank insulating layer covering an edge of the lower electrode, the bank insulating layer extending onto the second region of the reflective electrode;
    an upper electrode on a portion of the lower electrode exposed by the bank insulating layer, the upper electrode extending onto the bank insulating layer; and
    a light-emitting layer between the lower electrode and the upper electrode, the light-emitting layer extending between the bank insulating layer and the upper electrode, the light-emitting layer extending over all of the first, second, and third regions of the reflective electrode,
    wherein a sum of products of thicknesses and refractive indexes of each of the layers that are stacked between the second region of the reflective electrode and the upper electrode is a first value,
    wherein the lower electrode is in contact with an upper surface of the first region of the reflective electrode toward the upper electrode,
    wherein the lower electrode has a sidewall, the second region of the reflective electrode has a sidewall facing the sidewall of the lower electrode, and the bank insulating layer is between the sidewall of the lower electrode and the sidewall of the second region of the reflective electrode,
    wherein a sum of products of thicknesses and refractive indexes of each of the layers that are stacked between the first region of the reflective electrode and the upper electrode is a second value, and
    wherein the second value is equal to the first value, so that an optical path between the second region of the reflective electrode and the upper electrode is the same as an optical path between the first region of the reflective electrode and the upper electrode.

2. The display device according to claim 1, wherein a straight distance between the second region of the reflective electrode and the upper electrode is different from a straight distance between the first region of the reflective electrode and the upper electrode.

3. The display device according to claim 1, wherein the light-emitting layer is in contact with the lower electrode and the bank insulating layer.

4. The display device according to claim 3, wherein:
    the refractive index of the bank insulating layer is smaller than the refractive index of the lower electrode; and
    a thickness of the bank insulating layer on the second region of the reflective electrode is greater than a thickness of the lower electrode on the first region of the reflective electrode.

5. The display device according to claim 1, wherein the bank insulating layer includes an inorganic insulating material.

6. The display device according to claim 1, wherein the lower electrode is disposed only on the first region of the reflective electrode.

7. The display device according to claim 1, wherein the bank insulating layer is on the first region and the second region of the reflective electrode, and
    wherein the bank insulating layer is on the lower electrode over the first region of the reflective electrode, and a bottom surface of the bank insulating layer is coplanar with a bottom surface of the lower electrode over the first region of the reflective electrode.

8. A display device, comprising:
    a lower electrode on a lower substrate;
    a first bank insulating layer spaced from the lower electrode, the first bank insulating layer having an inclined side surface that faces the lower electrode;
    a second bank insulating layer covering an edge of the lower electrode and on the inclined side surface of the first bank insulating layer;
    a reflective electrode including a first region between the lower substrate and the lower electrode, a second region between the inclined side surface of the first bank insulating layer and the second bank insulating layer, and a third region on an upper surface of the first bank insulating layer opposite to the lower substrate;
    a light-emitting layer on a portion of the lower electrode exposed by the second bank insulating layer, the light-emitting layer extending along a surface of the second bank insulating layer, the light-emitting layer overlapping with the second region and the third region of the reflective electrode; and
    an upper electrode on the light-emitting layer, wherein the lower electrode is in contact with an upper surface of the first region of the reflective electrode toward the upper electrode, wherein the inclined side surface of the first bank insulating layer is disposed outside the lower electrode, wherein the second bank insulating layer includes a portion overlapping an area between the first region and the third region of the reflective electrode, wherein the second bank insulating layer is on the first region and the second region of the reflective electrode, wherein the second bank insulating layer is on the lower electrode over the first region of the reflective electrode, and a bottom surface of the second bank insulating layer is coplanar with a bottom surface of the lower electrode over the first region of the reflective electrode, and wherein a thickness ratio of the portion of the second bank insulating layer and the lower electrode is the same as the refractive index ratio of the lower electrode and the portion of the second bank insulating layer.

9. The display device according to claim 8, wherein the portion of the second bank insulating layer and the lower electrode are in contact with the reflective electrode.

10. The display device according to claim 8, wherein the second bank insulating layer includes a material different from the first bank insulating layer.

11. The display device according to claim 10, wherein the first bank insulating layer includes an organic insulating material.

12. The display device according to claim 8, wherein:
the inclined side surface of the first bank insulating layer includes a first region having a first inclination angle, and a second region having a second inclination angle that is smaller than the first inclination angle, and
the first region of the first bank insulating layer is between the lower substrate and the second region of the first bank insulating layer.

13. The display device according to claim 12, wherein the first region of the first bank insulating layer has a vertical distance larger than a thickness of the reflective electrode.

14. The display device according to claim 8, further comprising:
an over-coat layer between the lower substrate and the lower electrode,
wherein the second bank insulating layer includes a same material as the over-coat layer.

15. The display device according to claim 8, wherein the lower electrode is disposed only on a portion of the reflective electrode overlapping a flat surface of the first bank insulating layer.

16. The display device according to claim 8, wherein the lower electrode has a sidewall, the second region of the reflective electrode has a sidewall facing the sidewall of the lower electrode, and the second bank insulating layer is between the sidewall of the lower electrode and the sidewall of the second region of the reflective electrode.

* * * * *